(12) United States Patent
Ye et al.

(10) Patent No.: US 7,955,720 B2
(45) Date of Patent: Jun. 7, 2011

(54) POLYMER COMPRISING PHENYL PYRIDINE UNITS

(75) Inventors: Qing Ye, Mountain View, CA (US); Jie Liu, Niskayuna, NY (US); Yangang Liang, Shanghai (CN); Shengxia Liu, Shanghai (CN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/810,197

(22) PCT Filed: Dec. 6, 2008

(86) PCT No.: PCT/US2008/085761
§ 371 (c)(1),
(2), (4) Date: Jun. 23, 2010

(87) PCT Pub. No.: WO2009/082610
PCT Pub. Date: Jul. 2, 2009

(65) Prior Publication Data
US 2010/0276639 A1    Nov. 4, 2010

(30) Foreign Application Priority Data
Dec. 25, 2007 (CN) .......................... 2007 1 0301569

(51) Int. Cl.
*C09K 11/02* (2006.01)
(52) U.S. Cl. .................. 428/690; 252/301.5; 526/263
(58) Field of Classification Search .................. None
See application file for complete search history.

(56) References Cited

U.S. PATENT DOCUMENTS

| | | | |
|---|---|---|---|
| 6,545,159 B2 * | 4/2003 | Lee et al. | 546/348 |
| 2004/0062952 A1 | 4/2004 | Okada et al. | |
| 2007/0231467 A1 | 10/2007 | Takashima et al. | |

FOREIGN PATENT DOCUMENTS

| | | |
|---|---|---|
| DE | 102005056180 A1 | 6/2007 |
| EP | 1245659 A1 | 10/2002 |
| JP | 2003-282270 * | 10/2003 |

OTHER PUBLICATIONS

International Search Report for PCT Application PCT/US2008/085761 filed Dec. 6, 2008.

* cited by examiner

*Primary Examiner* — D. Lawrence Tarazano
*Assistant Examiner* — Gregory Clark
(74) *Attorney, Agent, or Firm* — GE Global Patent Operation; Peter T. DiMauro

(57) ABSTRACT

The invention relates to a polymer comprising structural unit of formula II:

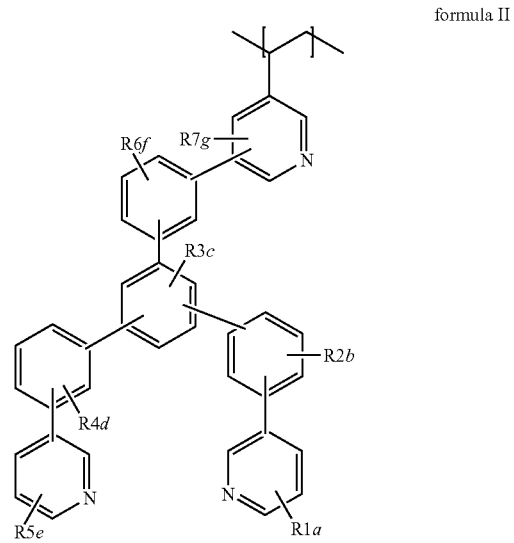

formula II wherein
$R^1$, $R^2$, $R^3$, $R^4$, $R^5$, $R^6$ and $R^7$ are independently at each occurrence a $C_1$-$C_{20}$ aliphatic radical, a $C_3$-$C_{20}$ aromatic radical, or a $C_3$-$C_{20}$ cycloaliphatic radical;
a, b, d, e and f are independently at each occurrence 0, or an integer ranging from 1 to 4;
c and g are independently at each occurrence 0, or an integer ranging from 1 to 3.

In another aspect, the invention relates to monomers for preparing the polymers. In yet another aspect, the invention relates to an optical electronic device comprising a polymer comprising structural unit of formula II.

22 Claims, No Drawings

POLYMER COMPRISING PHENYL PYRIDINE UNITS

BACKGROUND

The invention relates generally to polymers, and particularly to polymers comprising phenyl pyridine units, monomers for preparing the polymers and optical electronic devices using the polymers.

Optical electronic devices, e.g. Organic Light Emitting Devices (OLEDs), which make use of thin film materials that emit light when subjected to a voltage bias, are expected to become an increasingly popular form of flat panel display technology. This is because OLEDs have a wide variety of potential applications, including cellphones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs). Due to their high luminous efficiencies, OLEDs are seen as having the potential to replace incandescent, and perhaps even fluorescent, lamps for certain types of applications.

OLEDs possess a sandwiched structure, which consists of one or more organic layers between two opposite electrodes. For instance, multi-layered devices usually comprise at least three layers: a hole injection/transporting layer, an emissive layer and an electron transporting layer (ETL). Furthermore, it is also preferred that the hole injection/transporting layer serves as an electron blocking layer and the ETL as a hole blocking layer. Single-layered OLEDs comprise only one layer of materials between two opposite electrodes.

OLEDs are not very popular nowadays yet due to stabilities and/or feasibilities thereof. People are trying to improve OLEDs in many ways, one of which is to provide materials more suitable for OLEDs.

BRIEF DESCRIPTION

In one aspect, the invention relates to a polymer comprising structural unit of formula I, and/or II:

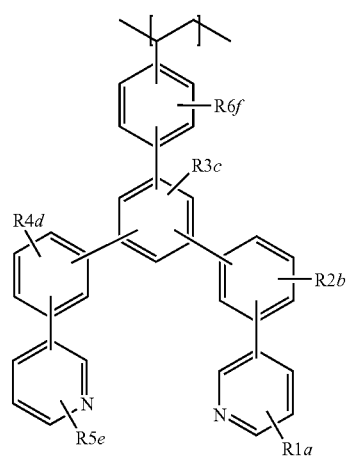

formula I

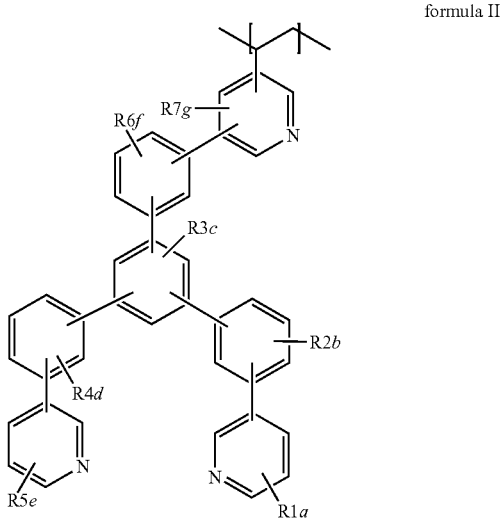

formula II wherein
$R^1$, $R^2$, $R^3$, $R^4$, $R^5$, $R^6$ and $R^7$ are independently at each occurrence a $C_1$-$C_{20}$ aliphatic radical, a $C_3$-$C_{20}$ aromatic radical, or a $C_3$-$C_{20}$ cycloaliphatic radical;
a, b, d, e, and f are independently at each occurrence 0, or an integer ranging from 1 to 4; and
c and g are independently at each occurrence 0, or an integer ranging from 1 to 3.

In another aspect, the invention relates to monomers for preparing the polymers. In yet another aspect, the invention relates to an optical electronic device comprising a polymer comprising structural unit of formula I and/or II.

DETAILED DESCRIPTION

In one aspect, the invention relates to polymers comprising structural unit of formula I and/or II. The polymers are prepared by polymerizing phenyl pyridine monomers or copolymerizing phenyl pyridine monomers with one or more comonomers to result in copolymers, and combinations thereof, in the form of random, block or graft copolymers, or dendrimers or hyper-branched materials. For example, monomers containing non conductive groups, such as styrenes, (meth)acrylates and vinyl pyridines, can be used as comonomers.

Monomers containing heteroaromatic electron transporting groups, such as phenyl pyridines, triazines, and oxathiazoles, can also be used as comonomers. Examples include vinylphenylpyridine and vinyltriazine described in U.S. Pat. No. 7,056,600.

Monomers containing aromatic and/or heteroaromatic hole transporting groups, such as carbazoles and triarylamines, can also be used as comonomers. Examples include vinylcarbazole and poly(2,7-(9,9-din-octylfluorene)-(1,4-phenylene-((4-sec-butylphenyl)imino)-1,4-phenylene)) (TFB), poly(9,9-dioctylfluorene-co-bis-N,N'-(4-butylphenyl)-bis-N,N'-phenyl-1,4-phenylenedi amine) (PFB), poly(2,7-(9,9-di-n-octylfluorene)-(1,4-phenylene-((4-methoxyphenyl)imino)-1,4-phenylene-((4-methoxyphenyl)imino)-1,4- phenylene))(PFMO), poly(9,9'-dioctylfluorene-co-bis-N,N'-(4-butylphenyl)-bis-N,N'-phenylbenzidine (BFE) described in US patent application publication No. 2007/0241675 published on Oct. 18, 2007 and international patent application publication No. 99/54385 published on Oct. 28, 1999.

Monomers containing light emitting groups, for example phosphorescent dyes, may also be used as comonomers. Examples include polymerizable iridium complexes described in PCT/US07/68620, filed on 7 May 2007 and in international patent application publication No. 2007109657 published on Sep. 27, 2007.

The invention relates to polymers comprising any single type or combination of light emitting moieties, hole transporting moieties, electron transporting moieties, and non-conductive moieties.

In a particular aspect, the invention relates to a polymer of formula III

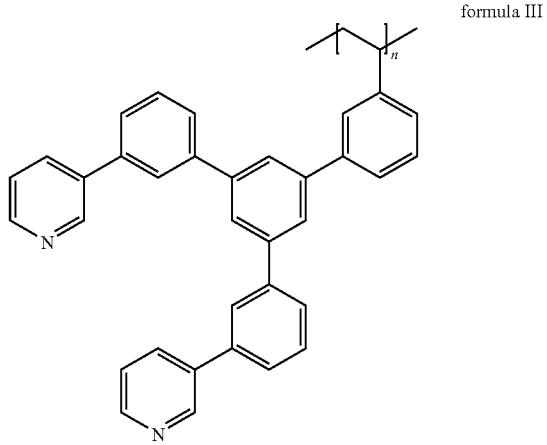

formula III wherein n is independently at each occurrence an integer >0, preferably >7, most preferrably >20.

In another aspect, the invention relates to a copolymer having formula IV

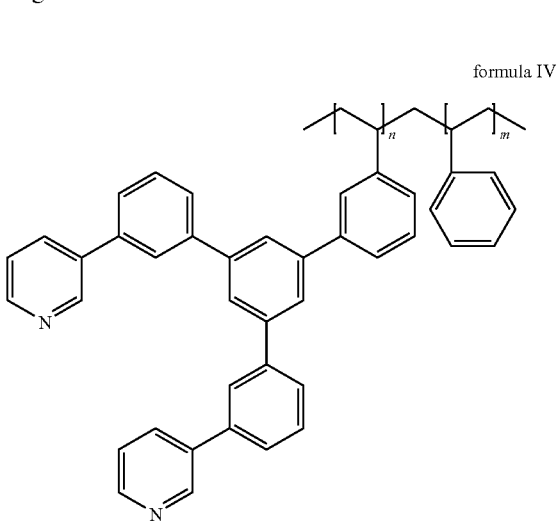

formula IV wherein n is independently at each occurrence an integer >0, preferably >7, most preferrably >20;

m is independently at each occurrence 0 or an integer >0, preferably >7, most preferably >20.

In yet another aspect, the invention relates to a polymer having formula V

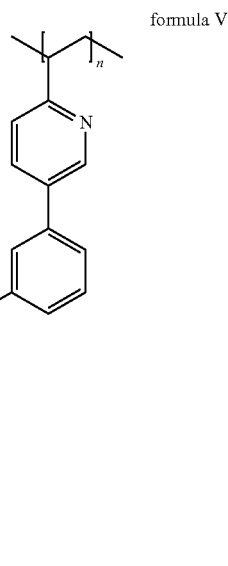

formula V wherein n is independently at each occurrence an integer >0, preferably >7, most preferrably >20.

In yet another aspect, the invention relates to a polymer having formula VI

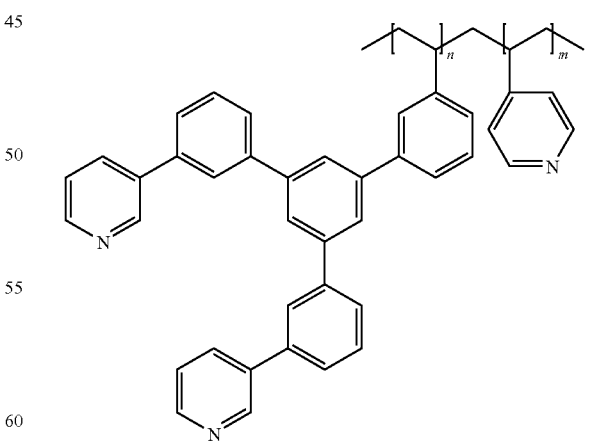

wherein n is independently at each occurrence an integer >0, preferably >7, most preferrably >20;

m is independently at each occurrence 0 or an integer >0, preferably >7, most preferably >20.

In another aspect, the invention relates to a polymer having formula

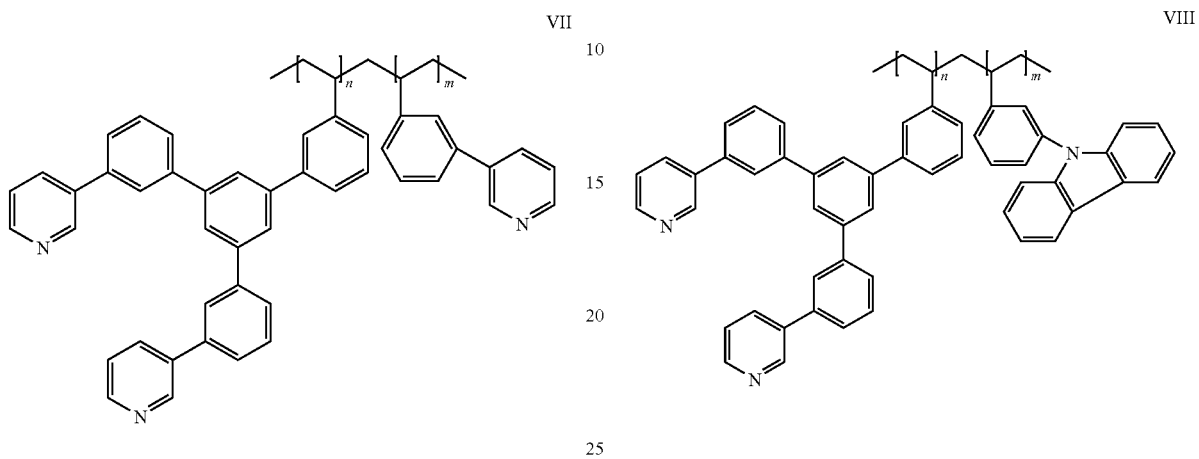

wherein n is independently at each occurrence an integer >0, preferably >7, most preferrably >20;

m is independently at each occurrence 0 or an integer >0, preferably >7, most preferably >20.

In another aspect, the invention relates to a polymer having formula wherein n is independently at each occurrence an integer >0, preferably >7, most preferably >20;

m is independently at each occurrence 0 or an integer >0, preferably >7, most preferably >20.

In yet another aspect, the invention relates to a polymer having formula

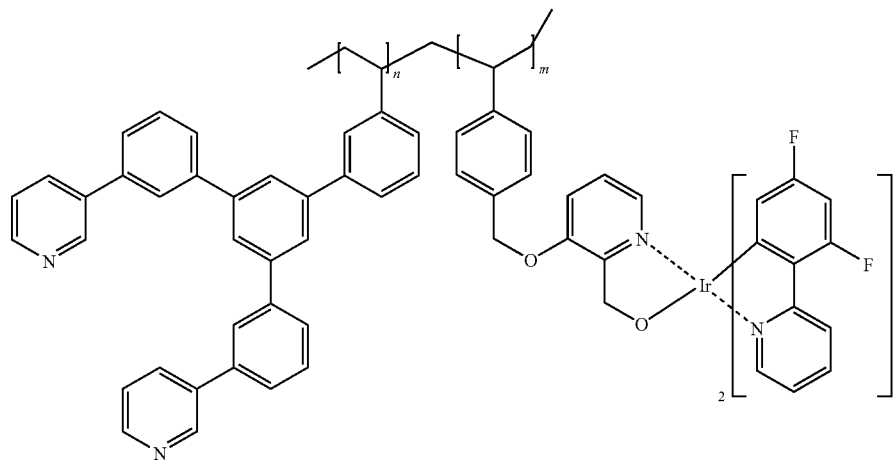

wherein n is independently at each occurrence an integer >0, preferably >7, most preferably >20;
m is independently at each occurrence 0 or an integer >0, preferably >7, most preferably >20.

In yet another aspect, the invention relates to a polymer having formula X:

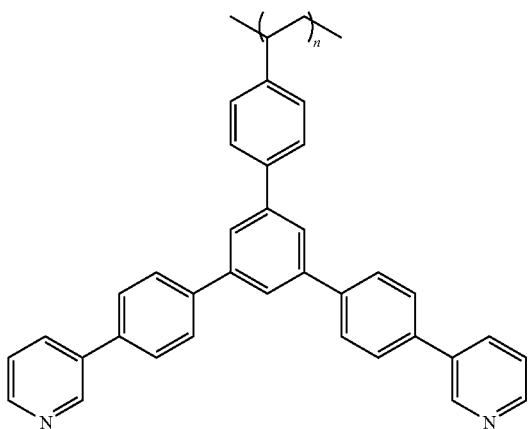

wherein n is independently at each occurrence an integer >0, preferably >7, most preferably >20.

In yet another aspect, the invention relates to a polymer having formula XI:

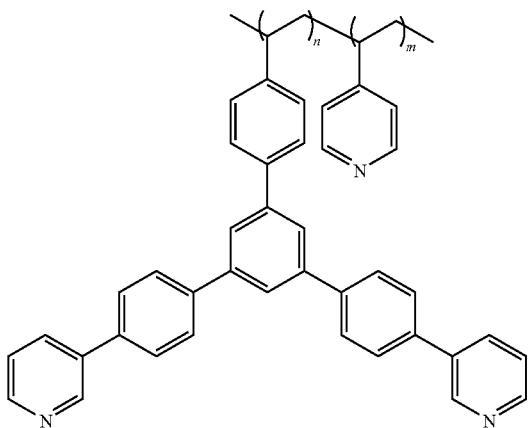

wherein n is independently at each occurrence an integer >0, preferably >7, most preferably >20;
m is independently at each occurrence 0 or an integer >0, preferably >7, most preferably >20.

Reaction conditions useful for the preparation of the polymers of the present invention include the use of polar solvents and bases of suitable strength. Exemplary solvents include chloroform, methylene chloride, orthodichlorobenzene, veratrole, anisole, and combinations thereof. Exemplary bases include triethylamine, sodium hydroxide, potassium hydroxide, and combinations thereof. Suitable catalysts may also be employed to effect the polymerization reaction.

In some embodiments, the polymer useful in the invention is a homopolymer. In other embodiments, the polymer is a copolymer and additionally includes non-conductive moieties, hole transporting moieties, electron transporting moieties, light emitting moieties and combinations thereof. The copolymer may be a block copolymer, a random copolymer, an alternating copolymer, or a graft copolymer. The different kinds of copolymers may be obtained by the appropriate choice of monomers, reaction conditions such as initiators, temperature, and/or solvent. Polymers useful in the invention may be made by the polymerization of monomers effected by initiators that include free radical initiators, cationic initiators, anionic initiators, and the like. Polymerization may be effected in the bulk state, in solution using a suitable solvent, or in an appropriate suspension or emulsion state. In one particular embodiment, the polymerization is effected using free radical initiators such as azobisisobutyronitrile in a dipolar solvent such as DMF or NMP.

Methods for polymerizing vinyl monomers are well known in the art. In certain embodiments, the polymerization reaction may be conducted at a temperature that ranges from about −50° C. to about 100° C. The polymerization may also be conducted at atmospheric pressure, subatmospheric pressures, or superatmospheric pressures. The polymerization reaction is conducted for a time period necessary to achieve polymer of a suitable molecular weight. The molecular weight of a polymer is determined by any of the techniques known to those skilled in the art, and include viscosity measurements, light scattering, osmometry, and the like. The molecular weight of a polymer is typically represented as a number average molecular weight $M_n$, or weight average molecular weight, $M_w$. A particularly useful technique to determine molecular weight averages is gel permeation chromatography (GPC), from wherein both number average and weight average molecular weights are obtained. In some embodiments, it is desirable that $M_w$ of the polymer is sufficiently high to allow film formation, typically greater than about 5,000 grams per mole (g/mol) is desirable, in other embodiments, polymers of $M_n$ greater than 30,000 g/mol is desirable, while in yet other embodiments, polymer of $M_n$ greater than 70,000 g/mol is desirable. $M_w$ is determined using polystyrene as standard.

Polymers useful in the invention can also be synthesized by post functionalization. For example the same polymer structure can be realized by carrying on Suzuki coupling reaction between bromostyrene and appropriate structures bearing boronic ester or boronic acid moieties.

An optical electronic device, e.g., an OLED, typically includes in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet excitons transfer energy to the environment by radiative decay.

Other components which may be present in an optical electronic device in addition to the anode, cathode and light emitting material include hole injection layers, electron injection layers, and electron transporting layers. The electron transporting layer need not be in contact with the cathode, and frequently the electron transporting layer is not an efficient hole transporter and thus it serves to block holes migrating toward the cathode. During operation of an organic light emitting device comprising an electron transporting layer, the majority of charge carriers (i.e. holes and electrons) present in the electron transporting layer are electrons and light emission can occur through recombination of holes and electrons present in the electron transporting layer. Additional components which may be present in an organic light emitting device include hole transporting layers, hole transporting emission (emitting) layers and electron transporting emission (emitting) layers.

Polymers comprising structural unit of formula I and/or II have suitable properties useful in applications such as optical electronic devices, e.g., organic light emitting devices (OLEDs). The polymers of the present invention are particularly well suited for use in both multi-layered OLEDs and single-layered OLEDs. The OLEDs comprising the polymers of the invention may be a phosphorescent OLED containing one or more, any or a combination of blue, yellow, orange, red phosphoresce dyes. Polymers of the present invention can be part of emissive layer, or hole transporting layer or electron transporting layer, or electron injection layer of OLEDS or any combination thereof.

The organic electroluminescent layer, i.e., the emissive layer, is a layer within an organic light emitting device which when in operation contains a significant concentration of both electrons and holes and provides sites for exciton formation and light emission. A hole injection layer is a layer in contact with the anode which promotes the injection of holes from the anode into the interior layers of the OLED; and an electron injection layer is a layer in contact with the cathode that promotes the injection of electrons from the cathode into the OLED; an electron transporting layer is a layer which facilitates conduction of electrons from cathode to a charge recombination site. The electron transporting layer need not be in contact with the cathode, and frequently the electron transporting layer is not an efficient hole transporter and thus it serves to block holes migrating toward the cathode. During operation of an organic light emitting device comprising an electron transporting layer, the majority of charge carriers (i.e. holes and electrons) present in the electron transporting layer are electrons and light emission can occur through recombination of holes and electrons present in the electron transporting layer. A hole transporting layer is a layer which when the OLED is in operation facilitates conduction of holes from the anode to charge recombination sites and which need not be in contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. An electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode include materials having a bulk conductivity of at least about 100 ohms per square, as measured by a four-point probe technique. Indium tin oxide (ITO) is frequently used as the anode because it is substantially transparent to light transmission and thus facilitates the escape of light emitted from electro-active organic layer. Other materials which may be utilized as the anode layer include tin oxide, indium oxide, zinc oxide, indium zinc oxide, zinc indium tin oxide, antimony oxide, and mixtures thereof.

Materials suitable for use as the cathode include by zero valent metals which can inject negative charge carriers (electrons) into the inner layer(s) of the OLED. Various zero valent metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a zero valent metal, such as aluminum or silver. In particular, the cathode may be composed of a single zero valent metal, and especially of aluminum metal.

The invention relates to polymers which may be used in electron transporting layers in place of, or in addition to traditional materials such as poly(9,9-dioctyl fluorene), tris (8-hydroxyquinolato) aluminum ($Alq_3$), 2,9-dimethyl-4,7-diphenyl-1,1-phenanthroline, 4,7-diphenyl-1,10-phenanthroline, 2-(4-biphenylyl)-5-(4-t-butylphenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

Materials suitable for use in hole transporting layers include 1,1-bis((di-4-tolylamino)phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino) benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylendioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371. The invention relates to polymers which may be used in place of, or in addition to aforementioned materials.

Materials suitable for use in the light emitting layer include electroluminescent polymers such as polyfluorene, preferably poly(9,9-dioctyl fluorene), poly(2,7-(9,9-di-n-octylfluorene) (F8) and poly(2,7-(9,9-di-n-octylfluorene)-(1,4-phenylene-((4-secbutylphenyl)imino-)-1,4-phenylene) (TFB) described in U.S. Pat. No. 7,116,308, poly(vinyl carbazole) and poly phenyl vinylene and their derivatives. The invention relates to polymers which may be used in place of, or in addition to aforementioned materials.

In one aspect, polymers comprising structural unit of formula I and/or II may form part of the electron transporting layer or electron injection layer or hole transporting layer or light emissive layer. Thus, in one aspect, the present invention relates to more efficient optical electronic devices, e.g., OLEDs comprising polymers comprising structural unit of formula I and/or II. The OLEDs may be phosphorescent containing one or more, any or a combination of, blue, yellow, orange, red phosphorescent dyes.

DEFINITIONS

As used herein, the term "aromatic radical" refers to an array of atoms having a valence of at least one comprising at least one aromatic group. The array of atoms having a valence of at least one comprising at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having $4n+2$ "delocalized" electrons where "n" is an integer equal to 1 or greater, as illustrated by phenyl groups (n=1), thienyl groups (n=1), furanyl groups (n=1), naphthyl groups (n=2), azulenyl groups (n=2), and anthraceneyl groups (n=3). The aromatic radical may also include nonaromatic components. For example, a benzyl group is an aromatic radical which comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehydes groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical comprising a methyl group, the methyl group being a functional group which is an alkyl group. Similarly, the 2-nitrophenyl group is a $C_6$ aromatic radical comprising a nitro group, the nitro group being a functional group. Aromatic radicals include halogenated aromatic radicals such as 4-trifluoromethylphenyl, hexafluoroisopropylidenebis(4-phen-1-yloxy) (i.e., —OPhC($CF_3$)$_2$PhO—), 4-chloromethylphen-1-yl, 3-trifluorovinyl-2-thienyl, 3-trichloromethylphen-1-yl (i.e., 3-CCl$_3$Ph-), 4-(3-bromoprop-1-yl)phen-1-yl (i.e., 4-BrCH$_2$CH$_2$CH$_2$Ph-), and the like. Further examples of aromatic radicals include 4-allyloxyphen-1-oxy, 4-aminophen-1-yl (i.e., 4-H$_2$NPh-), 3-aminocarbonylphen-1-yl (i.e., NH$_2$COPh-), 4-benzoylphen-1-yl, dicyanomethylidenebis (4-phen-1-yloxy) (i.e., —OPhC(CN)$_2$PhO—), 3-methylphen-1-yl, methylenebis(4-phen-1-yloxy) (i.e., —OPhCH$_2$PhO—), 2-ethylphen-1-yl, phenylethenyl, 3-formyl-2-thienyl, 2-hexyl-5-furanyl, hexamethylene-1,6-bis(4-phen-1-yloxy) (i.e., —OPh(CH$_2$)$_6$PhO—), 4-hydroxymethylphen-1-yl (i.e., 4-HOCH$_2$Ph-), 4-mercaptomethylphen-1-yl (i.e., 4-HSCH$_2$Ph-), 4-methylthiophen-1-yl (i.e., 4-CH$_3$SPh-), 3-methoxyphen-1-yl, 2-methoxycarbonylphen-1-yloxy (e.g. methyl salicyl), 2-nitromethylphen-1-yl (i.e., 2-NO$_2$CH$_2$Ph), 3-trimethylsilylphen-1-yl, 4-t-butyldimethylsilylphenl-1-yl, 4-vinylphen-1-yl, vinylidenebis (phenyl), and the like. The term "a $C_3$-$C_{10}$ aromatic radical" includes aromatic radicals containing at least three but no more than 10 carbon atoms. The aromatic radical 1-imidazolyl ($C_3H_2N_2$—) represents a $C_3$ aromatic radical. The benzyl radical ($C_7H_7$—) represents a $C_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group ($C_6H_{11}CH_2$—) is an cycloaliphatic radical which comprises a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylcyclopent-1-yl radical is a $C_6$ cycloaliphatic radical comprising a methyl group, the methyl group being a functional group which is an alkyl group. Similarly, the 2-nitrocyclobut-1-yl radical is a $C_4$ cycloaliphatic radical comprising a nitro group, the nitro group being a functional group. A cycloaliphatic radical may comprise one or more halogen atoms which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylcyclooct-1-yl, 2-chlorodifluoromethylcyclohex-1-yl, hexafluoroisopropylidene-2,2-bis(cyclohex-4-yl) (i.e., —$C_6H_{10}$C($CF_3$)$_2$$C_6H_{10}$—), 2-chloromethylcyclohex-1-yl, 3-difluoromethylenecyclohex-1-yl, 4-trichloromethylcyclohex-1-yloxy, 4-bromodichloromethylcyclohex-1-ylthio, 2-bromoethylcyclopent-1-yl, 2-bromopropylcyclohex-1-yloxy (e.g. CH$_3$CHBrCH$_2$$C_6H_{10}$O—), and the like. Further examples of cycloaliphatic radicals include 4-allyloxycyclohex-1-yl, 4-aminocyclohex-1-yl (i.e., H$_2$$C_6H_{10}$—), 4-aminocarbonylcyclopent-1-yl (i.e., NH$_2$COC$_5$H$_8$—), 4-acetyloxycyclohex-1-yl, 2,2-dicyanoisopropylidenebis(cyclohex-4-yloxy) (i.e., —OC$_6$H$_{10}$C(CN)$_2$$C_6$H$_{10}$O—), 3-methylcyclohex-1-yl, methylenebis(cyclohex-4-yloxy) (i.e., —OC$_6$H$_{10}$CH$_2$$C_6$H$_{10}$O—), 1-ethylcyclobut-1-yl, cyclopropylethenyl, 3-formyl-2-terahydrofuranyl, 2-hexyl-5-tetrahydrofuranyl, hexamethylene-1,6-bis(cyclohex-4-yloxy) (i.e., —OC$_6$H$_{10}$(CH$_2$)$_6$$C_6$H$_{10}$O—), 4-hydroxymethylcyclohex-1-yl (i.e., 4-HOCH$_2$$C_6$H$_{10}$—), 4-mercaptomethylcyclohex-1-yl (i.e., 4-HSCH$_2$$C_6$H$_{10}$—), 4-methylthiocyclohex-1-yl (i.e., 4-CH$_3$SC$_6$H$_{10}$—), 4-methoxycyclohex-1-yl, 2-methoxycarbonylcyclohex-1-yloxy (2-CH$_3$OCOC$_6$H$_{10}$O—), 4-nitromethylcyclohex-1-yl (i.e., NO$_2$CH$_2$$C_6$H$_{10}$—), 3-trimethylsilylcyclohex-1-yl, 2-t-butyldimethylsilylcyclopent-1-yl, 4-trimethoxysilylethylcyclohex-1-yl (e.g. (CH$_3$O)$_3$SiCH$_2$CH$_2$$C_6$H$_{10}$—), 4-vinylcyclohexen-1-yl, vinylidenebis (cyclohexyl), and the like. The term "a $C_3$-$C_{10}$ cycloaliphatic radical" includes cycloaliphatic radicals containing at least three but no more than 10 carbon atoms. The cycloaliphatic radical 2-tetrahydrofuranyl ($C_4$H$_7$O—) represents a $C_4$ cycloaliphatic radical. The cyclohexylmethyl radical ($C_6$H$_{11}$CH$_2$—) represents a $C_7$ cycloaliphatic radical.

As used herein the term "aliphatic radical" refers to an organic radical having a valence of at least one consisting of a linear or branched array of atoms which is not cyclic. Aliphatic radicals are defined to comprise at least one carbon atom. The array of atoms comprising the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" organic radicals substituted with a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a $C_6$ aliphatic radical comprising a methyl group, the methyl group being a functional group which is an alkyl group. Similarly, the 4-nitrobut-1-yl group is a $C_4$ aliphatic radical comprising a nitro group, the nitro group being a functional group. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl, difluorovinylidene, trichloromethyl, bromodichloromethyl, bromoethyl, 2-bromotrimethylene (e.g. —$CH_2CHBrCH_2$—), and the like. Further examples of aliphatic radicals include allyl, aminocarbonyl (i.e., —$CONH_2$), carbonyl, 2,2-dicyanoisopropylidene (i.e., —$CH_2C(CN)_2CH_2$—), methyl (i.e., —$CH_3$), methylene (i.e., —$CH_2$—), ethyl, ethylene, formyl (i.e. —CHO), hexyl, hexamethylene, hydroxymethyl (i.e. —$CH_2OH$), mercaptomethyl (i.e., —$CH_2SH$), methylthio (i.e., —$SCH_3$), methylthiomethyl (i.e., —$CH_2SCH_3$), methoxy, methoxycarbonyl (i.e., $CH_3OCO$—), nitromethyl (i.e., —$CH_2NO_2$), thiocarbonyl, trimethylsilyl (i.e. $(CH_3)_3Si$—), t-butyldimethylsilyl, 3-trimethyoxysilypropyl (i.e., $(CH_3O)_3SiCH_2CH_2CH_2$—), vinyl, vinylidene, and the like. By way of further example, a $C_1$-$C_{10}$ aliphatic radical contains at least one but no more than 10 carbon atoms. A methyl group (i.e., $CH_3$—) is an example of a $C_i$ aliphatic radical. A decyl group (i.e., $CH_3(CH_2)_9$—) is an example of a $C_{10}$ aliphatic radical.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

EXAMPLES

Examples 1-19 describe the synthesis of polymers of the invention and intermediates used in making them. All reagents are purchased from Aldrich Chemical Co., Milwaukee, Wis., USA and Acros Organics unless otherwise specified and are used without further purification. All compounds are characterized by 1H-NMR and found to correspond to the structures shown.

General Methods

Molecular weights are determined relative to polystyrene standards on a Perkin Elmer Series 200 GPC equipped with a Polymer Laboratories size exclusion column (PLgel 5 μm MIXED-C, 300×7.5 mm kept at 40° C.) using chloroform with 3.6% v/v isopropanol as the mobile phase. NMR spectra are measured on a Bruker 400 or Bruker Advance 500 spectrometers.

Synthesis

The syntheses of the polymers of formulas III, IV and V are done by processes as shown in schemes 1-2.

Scheme 1. Synthesis of polymer of formulas III and IV

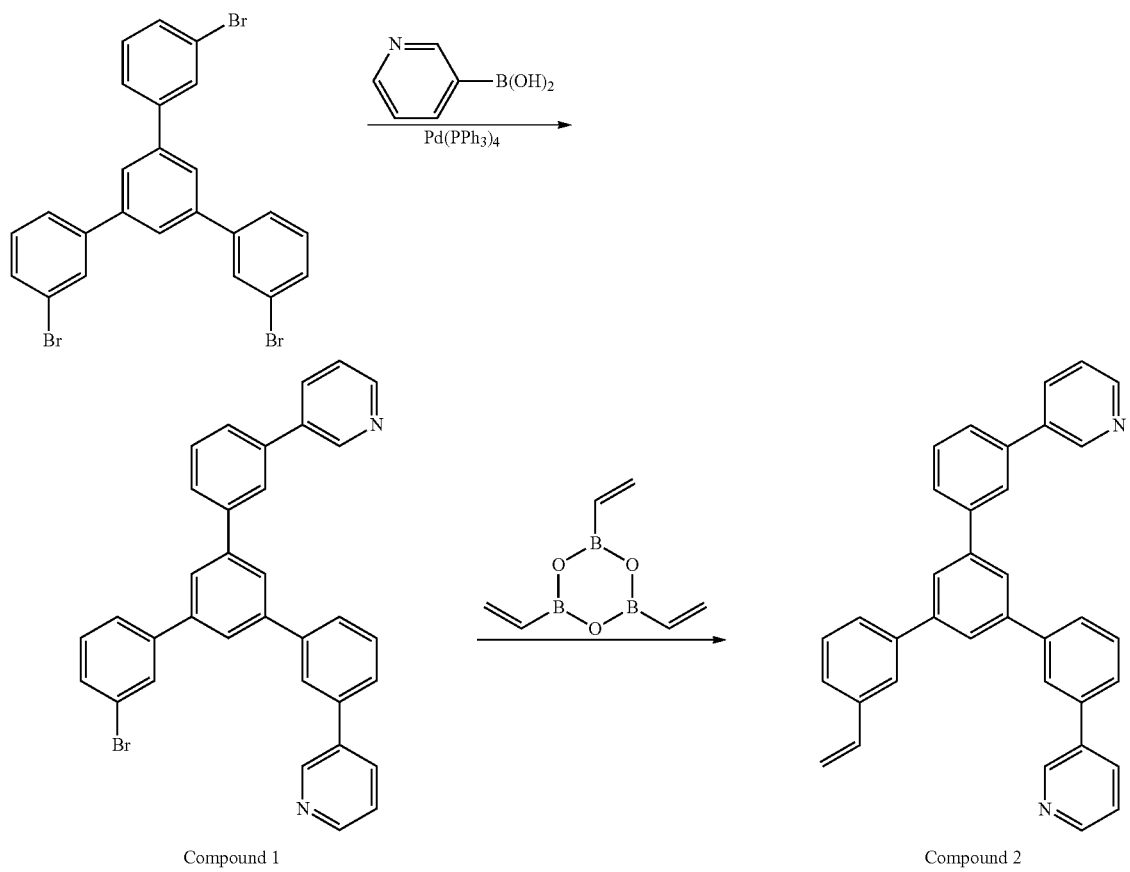

Compound 1　　　　　　　　　　　　　　　　　Compound 2

-continued
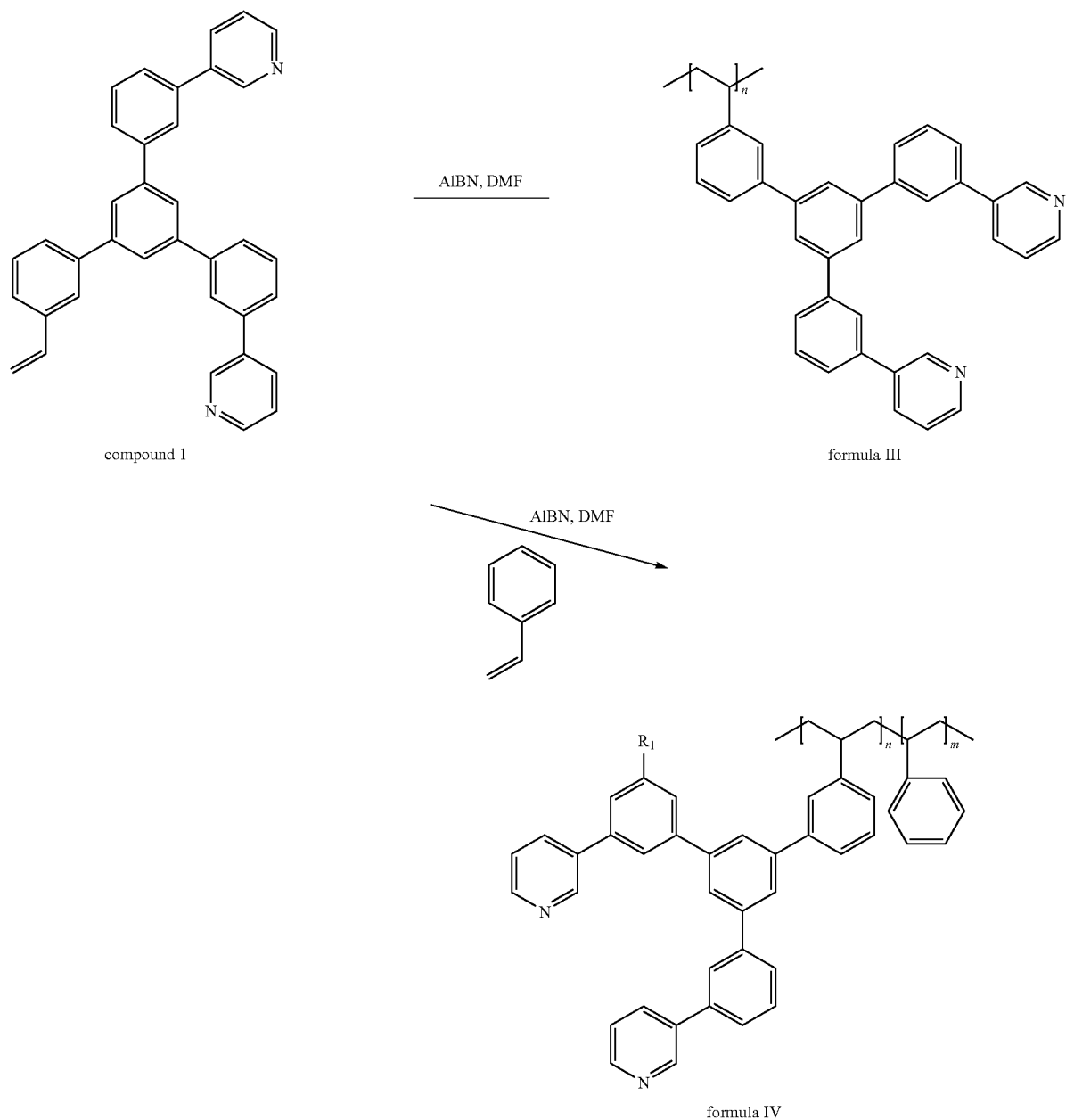
compound 1
formula III
formula IV
Scheme 2. Synthesis of polymer of formula V
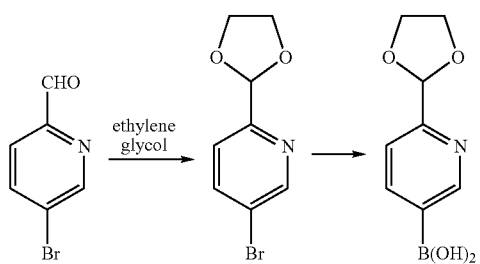

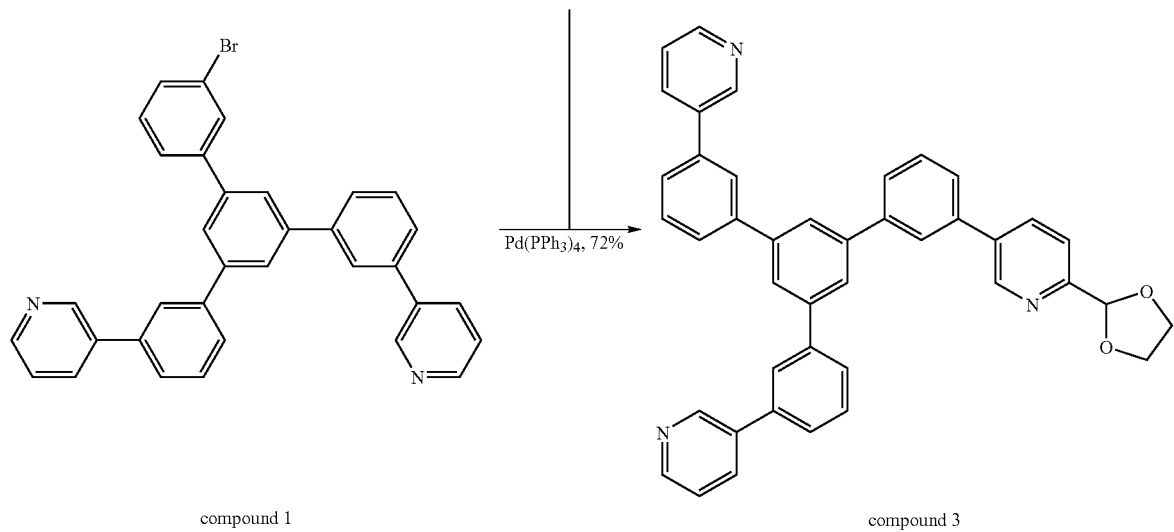
compound 1
Pd(PPh₃)₄, 72%
compound 3
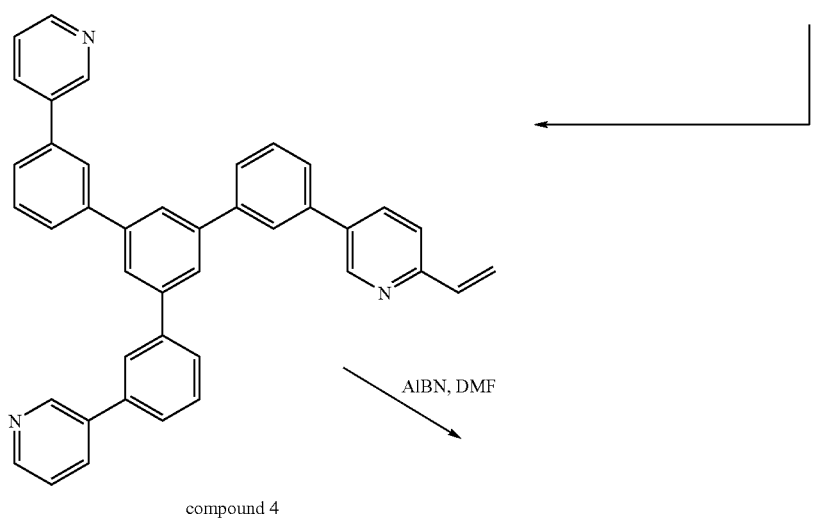
compound 4
AIBN, DMF
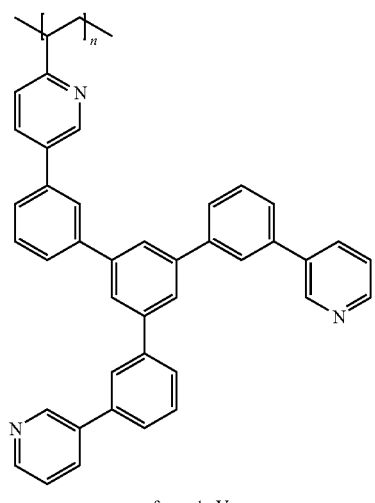
formula V

Example 1

Synthesis of Compound 1

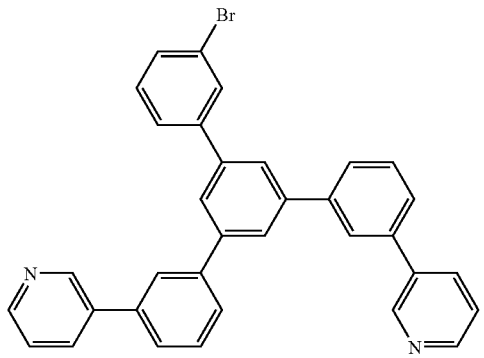

Compound 1

A 100 mL, round-bottomed Schlenk flask equipped with a magnetic stir bar is charged with 1,3,5-tri(3-bromobenzene)benzene (6.52 g, 12.0 mmol), 3-pyridyl boronic acid (3.69 g, 30 mmol), 25 mL of a 2M aqueous solution of Na2CO3, and 25 mL of 1,4-dioxane. Tetrakis (triphenylphosphine) palladium (0.54 g, 0.5 mmol) is added, the mixture is degassed using five vacuum/nitrogen back-fill cycles, and then is heated to 95° C. for 24 hours with vigorous stirring. The reaction mixture is allowed to cool to room temperature and diluted with $CH_2Cl_2$. The organic layer is washed with 1N HCl, $H_2O$, and brine, dried over $Na_2SO_4$, and concentrated to dryness by rotary evaporation. The resulting yellow solid is purified by column chromatography on silica gel. Eluent ethyl acetate gave compound 1 as a white solid 2.5 g (39%). $^1$H NMR (400 MHz, CDCl$_3$) δ 8.95 (br s, 2H), 8.65 (br s, 2H), 7.98-7.41 (m, 19H).

Example 2

Synthesis of Compound 2: meta-Biphenylpyridylbiphenylvinyl (m-BPPBV)

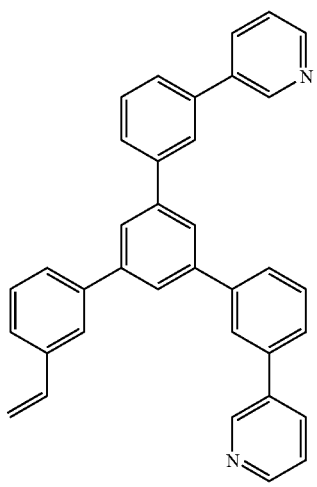

Compound 2

A 100 mL, two-necked, round-bottomed flask covered in tin foil and is equipped with a stirring bar, a reflux condenser fitted with a nitrogen inlet, and a stopper. The flask is charged compound 1 (1.54 g, 2.85 mmol), 1,4-dioxane (30 mL), and tetrakis (triphenylphosphine) palladium (66.9 mg, 0.056 mmol). The apparatus is maintained under an atmosphere of nitrogen during the course of the reaction. The mixture is stirred at room temperature for 20 min then potassium carbonate (0.64 g, 4.6 mmol) dissolved in distilled water (6 mL) is added via funnel, followed by 2,4,6-trivinylcyclotriboroxane-pyridine complex (0.6 g, 2.5 mmol). The reaction mixture is stirred and heated at reflux in an oil bath for 20 h, then cooled to ambient temperature. Distilled water (30 mL) is added via a funnel, and the resulting mixture is filtered on a Büchner funnel. The filtrate is transferred to a separatory funnel and extracted with $CH_2Cl_2$ (3×30 mL). The combined organic phases are dried over $Na_2SO_4$, filtered on filter paper and concentrated to dryness by rotary evaporation (30° C., 25 mmHg). The resulting yellow solid is purified by column chromatography affording as a pale yellow solid. The solid is dissolved in a hot mixture of ethanol:dichloromethane (4:1) (50 mL) and the warm mixture is filtered through a Büchner funnel. The filtrate is collected into a flask and is allowed to cool to room temperature for 20 min. The flask is immersed for 30 min in an ice bath in order to complete precipitation. The resulting solid is collected by suction filtration on a Büchner funnel, washed with hexane (10 mL), and dried under reduced pressure (15 h at 0.1 mmHg) to provide as a white solid 1.1 g (80%). $^1$H NMR (400 MHz, CDCl$_3$) δ 8.96 (br s, 2H), 8.92 (br s, 1H), 8.65 (m, 2H), 7.99-7.93 (m, 6H), 7.79 (m, 3H), 7.65 (m, 6H), 7.48-7.40 (m, 3H), 6.91 (dd, J=1.6, 3.2, 1H), 6.29 (d, J=4, 1H), 5.55 (d, J=2.4, 1H). $^{13}$C NMR (400 MHz, CDCl$_3$) δ 154.9, 148.7, 148.4, 148.0, 142.3, 141.9, 138.7, 138.5, 136.5, 135.1, 134.9, 134.5, 133.1, 132.2, 132.0, 131.9, 131.7, 130.6, 130.4, 129.7, 128.7, 128.5, 128.4, 127.2, 127.1, 126.5, 126.4, 126.3, 126.0, 125.6, 123.6, 121.1, 118.4.

Example 3

Synthesis of 5-bromo-2-(1,3-dioxolan-2-yl)pyridine

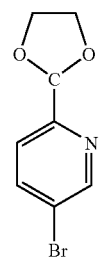

Ethyleneglycol (14.88 g, 0.24 mol) and p-toluenesulfonic acid (3 g, 0.16 mol) are added to a solution of 5-bromopyridine-2-carbaldehyde (30 g, 0.16 mol) in toluene (150 ml) at room temperature and the mixture is stirred for 10 hrs at refluxing temperature. After cooling to room temperature, the mixture is quenched with saturated aqueous NH$_4$Cl, extracted with $CH_2Cl_2$ and washed with $H_2O$. The aqueous layer is extracted with $CH_2Cl_2$ and the combined organic extract is washed with brine, dried over Na$_2$SO$_4$, and concentrated under reduced pressure. The residue is purified by silica gel column chromatography (hexane-AcOEt (9:1 V/V)) to afford 5-bromo-2-(1,3-dioxolan-2-yl)pyridine (30.9 g, 84%) as a colorless oil. %). $^1$H NMR (400 MHz, CDCl$_3$) δ 8.69 (s, 1H), 7.87 (m, 1H), 7.45 (m, 1H), 5.83 (s, 1H), 4.13 (m, 4H).

Example 4

Synthesis of 6-(1,3-dioxalan-2-yl)-pyridine-3-yl-3-boronic acid

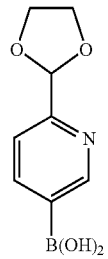

A 50 mL three-necked flask equipped with a temperature probe, an overhead stirrer, and a septum is charged with toluene (15 mL) and THF (4 mL) and put under a nitrogen atmosphere. The flask is charged with triisopropyl borate (1.96 g, 10.44 mmol) and 5-bromo-2-(1,3-dioxolan-2-yl)pyridine (2 g, 8.7 mmol). The mixture is cooled to −40° C. using a dry ice/acetone bath. N-Butyllithium (2.5 M in hexane, 4.2 ml, 10.5 mmol) is added dropwise via a syringe pump over 15 mins. And the mixture is stirred for an additional 0.5 h while the temperature is held at −40° C. The acetone/dry ice bath is removed, and the reaction mixture is then allowed to warm to −20° C. before a 2N HCl solution (20 mL) is added. When the mixture reached room temperature, it is transferred to a 250 mL separatory funnel and the aqueous layer (pH=1) is cut into a 150 mL Erlenmeyer flask. While the aqueous layer is stirred, its pH is adjusted to 6 using a 5N NaOH solution. A white solid product precipitated as the pH approached 6. This mixture is then saturated with NaCl, transferred to a 250 mL separatory funnel, and extracted three times with THF. The combined THF extracts are evaporated in vacuo to provide a solid 1.5 g (94%). $^1$H NMR (400 MHz, CDCl$_3$) δ 8.96 (s, 1H), 8.65 (br s, 1H), 7.98 (m, 1H), 7.83 (s, 1H), 4.14 (m, 4H).

Example 5

Synthesis of Compound 3

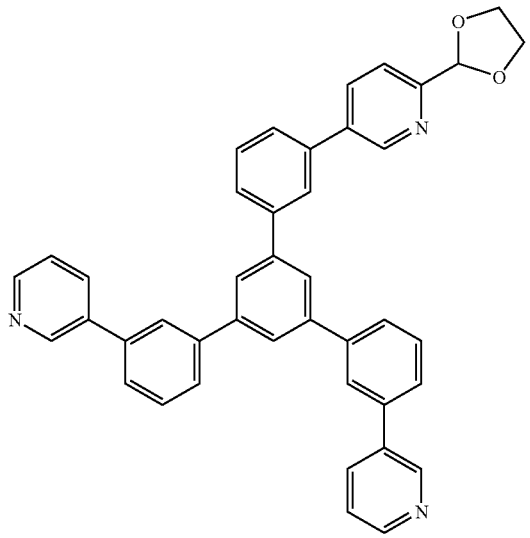

A 100 mL, round-bottomed Schlenk flask equipped with a magnetic stir bar is charged with Compound 1 (1.58 g, 2.93 mmol), 6-(1,3-dioxalan-2-yl)-pyridine-3-yl-3-boronic acid (1.06 g, 5.8 mmol), 10 mL of a 2M aqueous solution of Na$_2$CO$_3$, and 20 mL of 1,4-dioxane. Tetrakis (triphenylphosphine) palladium (0) (0.3 g, 0.28 mmol) is added, the mixture is degassed using five vacuum/nitrogen back-fill cycles, and then is heated to 95° C. for 24 hours with vigorous stirring. The reaction mixture is allowed to cool to room temperature and diluted with CH$_2$Cl$_2$. The organic layer is washed with 1N HCl, H$_2$O, and brine, dried over Na$_2$SO$_4$, and concentrated to dryness by rotary evaporation. The resulting yellow solid is purified by column chromatography on silica gel. Eluent ethyl acetate gave compound 3 as a pale yellow foam solid 1.29 g (72%). $^1$H NMR (400 MHz, CDCl$_3$) δ 8.95 (br s, 3H), 8.66 (br s, 2H), 8.04-7.43 (m, 21H), 5.96 (s, 1H), 4.18 (m, 4H).

Example 6

Synthesis of Aldehyde-TPPB

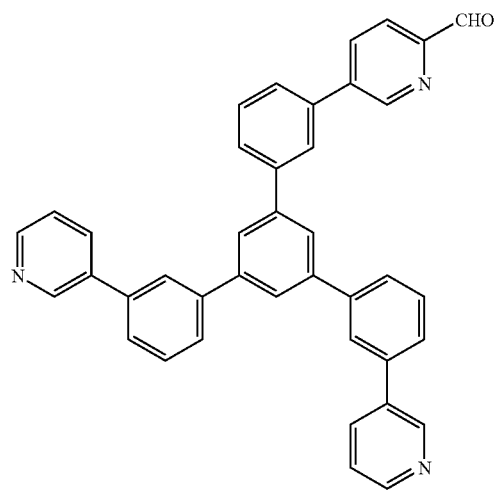

PPTS (1.59 g, 6.36 mmol) and compound 3 (1.29 g, 2.12 mmol) are added to a stirred solution of acetone (25 mL) and H$_2$O (5 mL) at 0° C. and stirring is continued for overnight at 56° C. Then the mixture is extracted with CH$_2$Cl$_2$ and washed with H$_2$O. The aqueous layer is extracted with CH$_2$Cl$_2$ and the combined organic extract is washed with brine, dried over Na$_2$SO$_4$, and concentrated under reduced pressure. The resulting yellow solid is purified by column chromatography on silica gel. Eluent ethyl acetate gave aldehyde-TPPB as a pale yellow foam solid 1.1 g (92%). $^1$H NMR (400 MHz, CDCl$_3$) δ 10.16 (s, 1H), 9.11 (br s, 1H), 8.95 (br s, 2H), 8.65 (br s, 2H), 8.16-7.42 (m, 21H).

Example 7

Synthesis of Compound 4:
meta-Triphenylpyridylbiphenylvinyl (m-TPPBV)

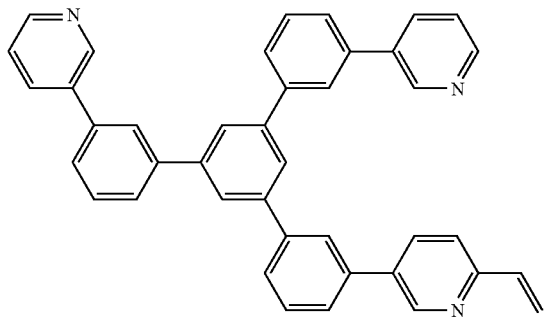

Methyltriphenylphosphonium bromide (2.19 g, 6 mmol) is dissolved in THF (20 mL) at 0° C. and stirred for 30 min. Then potassium tert-butoxide (0.673 g, 6 mmol) is added. The mixture solution is stirred at 0° C. for 1.5 hours and then is warmed to room temperature. A solution of aldehyde-TPPB (1.76 g, 3.11 mmol) is added slowly and the solution is stirred overnight. The solution is diluted with $CH_2Cl_2$ and washed with water and brine and dried with $Na_2SO_4$. The resulting yellow solid is purified by column chromatography affording as a pale yellow solid. The solid is dissolved in a hot mixture of ethanol:dichloromethane (4:1) (30 mL) and the warm mixture is filtered through a Büchner funnel. The filtrate is collected into a flask and is allowed to cool to room temperature for 20 min. The flask is immersed for 30 min in an ice bath in order to complete precipitation. The resulting solid is collected by suction filtration on a Büchner funnel, washed with hexane (10 mL), and dried under reduced pressure (15 h at 0.1 mmHg) to provide as a white solid 1.2 g (69%). $^1$H NMR (400 MHz, $CDCl_3$) δ 8.95 (br s, 2H), 8.91 (br s, 1H), 8.64 (m, 2H), 7.98-7.42 (m, 21H), 6.91 (dd, J=1.2, 2.4, 1H), 6.27 (d, J=2, 1H), 5.54 (d, J=1.2, 1H).

General Polymerization Procedure:

Given amounts of a monomer (m-BPPB-V, p-BPPB-V or TPPB-V), or a comonomer (styrene, vinylpyridine, vinylcarbazole, or vinylphenylpyridine), AIBN, and DMF are placed in an ampule, which is degassed completely by freezethaw method (repeated three times) and sealed. The ampule is placed in a bath thermostated at 40° C.-80° C., preferably 60° C., for time of polymerization and then opened. The reaction mixture is poured into an excess of ether to precipitate the polymer. For purification, the polymer obtained is dissolved in a small amount of dichloromethane and the resulting solution is poured into an excess of ether to precipitate the polymer again. The dissolution-precipitation procedure is twice repeated. The copolymer is dried under reduced pressure until a constant weight is achieved.

Number-average molecular weight (Mn) and weight-average molecular weight (Mw) of the polymer is determined by gel permeation chromatography (GPC) using NMP and standard polystyrenes as an eluent and references, respectively, unless otherwise specified.

Example 8

Synthesis of Polymer of Formula III
(poly(m-BPPB))

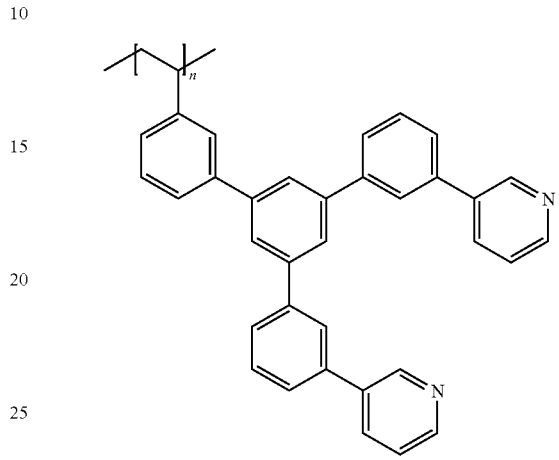

Monomer m-BPPBV (223.4 mg) is dissolved in 1 mL of DMF. To the solution is added initiator AIBN (2.6 mg, 1.2 wt %). The mixture is degassed with argon for 45 min. Polymerization is run for 3 days at 65-70° C. under argon. After it had been cooled down, the solution is precipitated into ether (50 mL) to afford poly(m-BPPB). GPC (Gel permeation chromatography) analysis[a] showed the polymer had a weight average molecular weight Mw of 24,000, a number average molecular weight $M_n$ of 8,600 and a polydispersity index (PDI) of 2.8.

[a] The GPC result is based on DMF as eluent.

Example 9

Synthesis of Copolymer of Formula IV
(poly(styrene-m-BPPB))

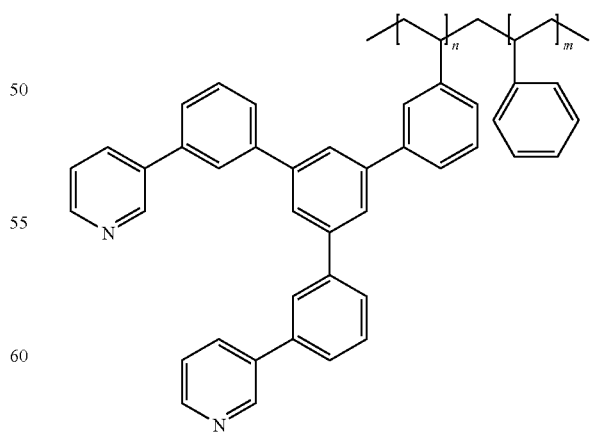

The procedures and reaction conditions are the same as that for poly(m-BPPB) except adding styrene as another monomer. The feed composition and GPC result[a] are as follows.

| Polymeric product | Monomer A/(mg) | Monomer B/(mg) | DMF | PDI | $M_n$ | Mw |
|---|---|---|---|---|---|---|
| Poly(styrene-m-STPPB) | m-BPPBV/110.0 | Styrene/116.0 | 1 mL | 2.97 | $9.2 \times 10^3$ | $2.7 \times 10^4$ |

[a] The GPC result is based on DMF as eluent.

Example 10

Synthesis of Polymer of Formula V (poly(m-TPPB))

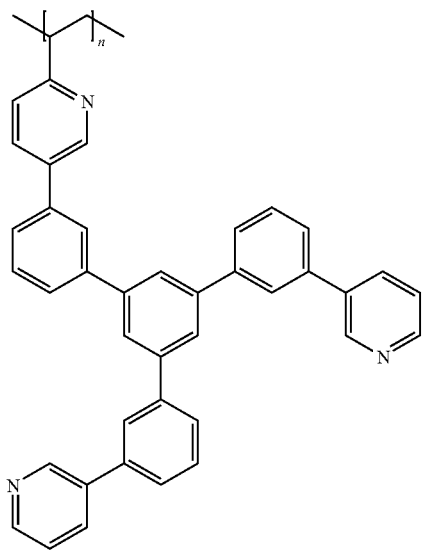

The procedures and reaction conditions are the same as that for poly(m-BPPB) except using m-TPPBV for m-BPPBV monomer.

Example 11

Synthesis of Polymer of Formula VI (poly(pyridine-m-BPPB))

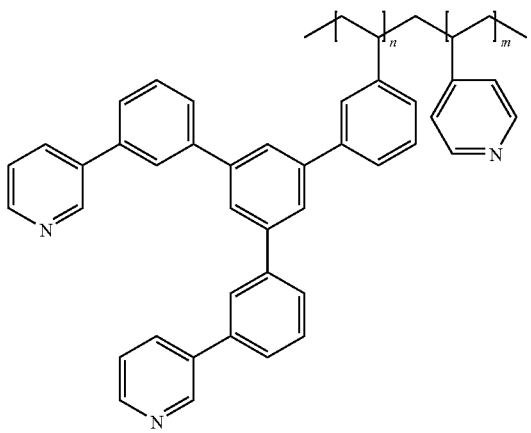

Poly(pyridine-m-BPPB) is prepared from monomer (BPPB) (130 mg) and 4-vinyl pyridine (80 mg) in DMF (1 mL) with AIBN (2.6 mg, 1.2 wt %) as initiator following the general polymerization procedure. Mn and Mw of the polymer are 9500 and 30000, respectively.

Example 12

Synthesis of Polymer of Formula VII (poly(vinylphenylpyridine-m-BPPB))

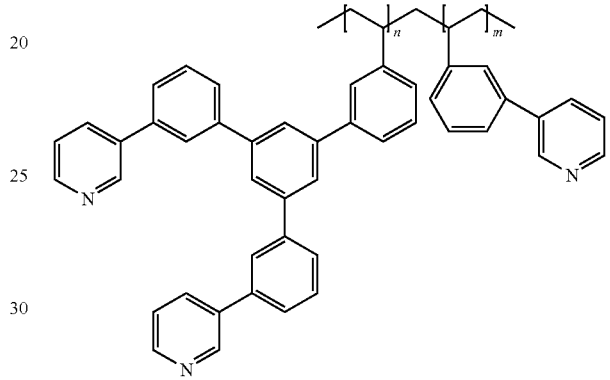

Poly(vinylphenylpyridine-m-BPPB) is prepared from monomer (BPPB) (160 mg) and vinylphenylpyridine (160 mg) in DMF (1 mL) with AIBN (3 mg, 0.9 wt %) as initiator following the general polymerization procedure. Mn and Mw of the polymer is 18000 and 41800, respectively.

Example 13

Synthesis of Polymer of Formula VIII (poly(vinylphenylcarbazole-m-BPPB))

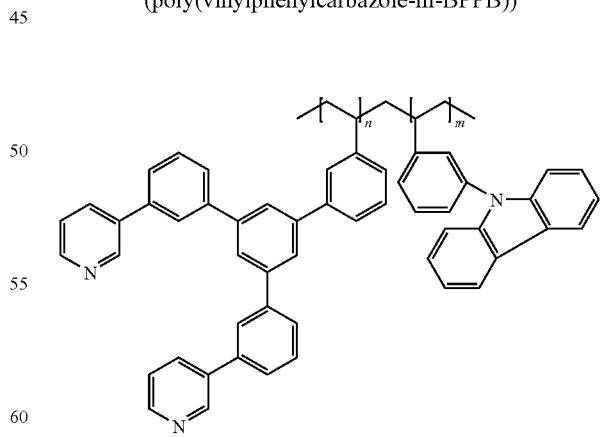

Poly(vinylphenylcarbazole-m-BPPB) is prepared from monomer (BPPB) (260 mg) and 3-vinylphenylcarbazole (258 mg) in DMF (1.5 mL) with AIBN (5 mg, 1.0 wt %) as initiator following the general polymerization procedure. Mn and Mw of the polymer is 15900 and 45100, respectively.

Example 14

Synthesis of Polymer of Formula IX

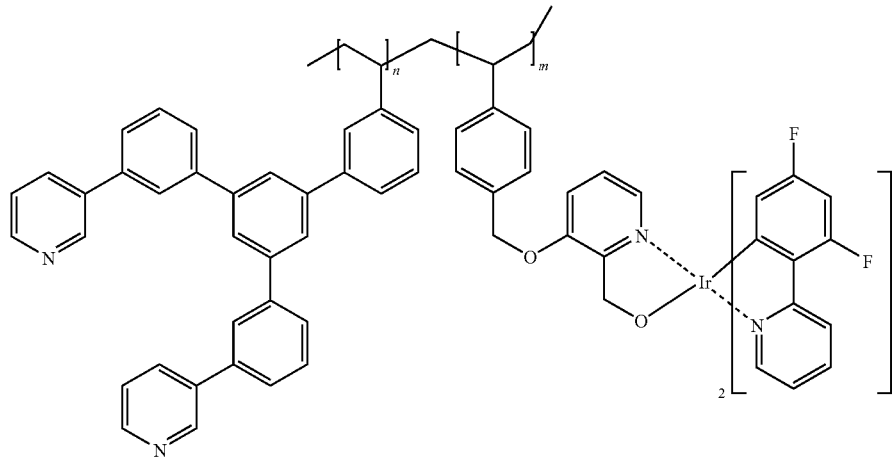

Vinyl monomers are weighed out in an amber vial. To this vial, appropriate amount of NMP is added together with AIBN in NMP solution (0.1 g/mL). Reaction mixture is stirred at room temperature until all styrenic Firpic completely dissolves. The reaction mixture is carefully transferred to a shlenk flask using a transfer pipette and 1 mL of NMP is used to rinse the flask and pipette. The shlenk flask is degassed three times using freeze-thaw cycle, and is placed into an oil bath at 65° C. The reaction mixture is stirred overnight and cooled to room temperature. $CH_2Cl_2$ is added to flask to dilute the solution if needed. And this mixture is drop wise added to 10 fold of methanol with stirring, white powder is collected through vacuum filtration. The collected polymer is re-dissolved into $CH_2Cl_2$ and re-precipitate out from Acetone. Again the polymer is collected using vacuum filtration and further dried in a vacuum oven at 50° C. overnight. GPC analysis is performed with chloroform as elute, PS as standards and a UV detector. The amount of Firpic is calculated from wt % of Ir in the polymer, which can be experimentally determined by Solution Nebulization Inductively Coupled Plasma Emission Spectrometry (ICP-AES, Varian Liberty II).

Example 15

Synthesis of Comonomer [(F$_2$ppy)$_2$Ir(3-acryloylpicolinate)]

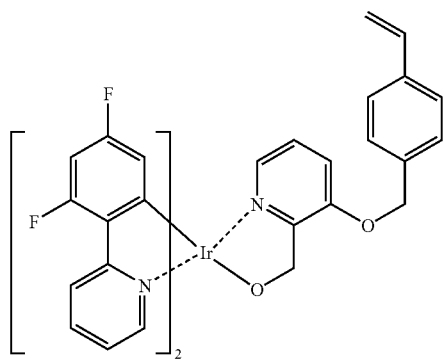

Step A. [(F2ppy)2Ir(3-hydroxypicolinate)] is prepared in the following manner. A 100 mL glass Wheaton vial is charged with sodium carbonate (2.4 g, 22.6 mmoles, Aldrich), 3-hydroxypicolinic acid (0.90 g, 6.5 mmoles, Aldrich), and [(F2PPy)$_2$IrCl]2 (2.5 g, 2.05 mmoles, American Dye Source) and then dissolved in 50 mL DMF (Aldrich). After addition of a 1inch magnetic stir bar, the vial is sealed with a crimp cap and purged with nitrogen by syringe for 10 minutes. After letting the solution stir for another 10 minutes, the initially yellow color took on an orange hue whereupon it is placed into a pre-heated (85° C.) oil bath overnight. The orange reaction mixture is cooled to room temperature and poured into water (500 mL). The aqueous mixture is extracted (3×50 mL) with ethyl acetate and dried over sodium sulfate. After concentrating by rotary evaporation, the orange residue is dissolved in a minimum of chloroform and re-crystallized with hexane. The product is collected by filtration and dried in vacuo. Yield (2 g, 68%). $^1$H NMR (400 MHz, de-DMSO, 25° C.) δ5.48 (dd, IH), 5.66 (dd, IH), 6.82 (m, 2H), 7.24 (d, IH), 7.35 (t, IH), 7.5 (m, IH), 7.62 (d, IH), 7.7 (d, IH), 7.96 (s, IH), 8.09 (m, 2H), 8.23 (m, 2H), 8.5 (d, IH), 13.56 (s, IH).

Step B. [(F2ppy)2Ir(3-acryloylpicolinate) Vinyl-FIrpic] is prepared as follows. A 20 mL glass Wheaton vial is charged with [(F2ppy)2Ir(3-hydroxypicolinate)] (0.25 g, 0.35 mmoles) and then dissolved in 10 mL chloroform (Aldrich). After addition of a ½ inch magnetic stir bar, acryloyl chloride (200 mg, 2.2 mmoles) and 0.5 mL of triethylamine (3.6 mmoles) are added by pipette. The vial is sealed with a crimp and stirred overnight at room temperature. The orange reaction mixture is concentrated and purified by flash chromatography (silica gel, gradient elution, chloroform:methanol 97:3 ratio). The product fraction is concentrated, taken up in minimum of chloroform and re-crystallized from hexanes. The yellow crystalline product is collected by filtration and dried in vacuo. Yield (144 mg, 54%). $^1$H NMR (400 MHz, de-DMSO, 25° C.) δ5.44 (dd, IH), 5.68 (dd, IH), 6.18 (d, IH), 6.39-6.54 (m, 2H), 6.8-6.9 (m, 2H), 7.35 (t, IH), 7.52 (t, IH), 7.65-7.77 (m, 3H), 8.0-8.11 (m, 3H), 8.28 (m, 2H), 8.50 (d, IH).
Example 16
Synthesis of Polymer of Formula X (Poly(p-BPPB))
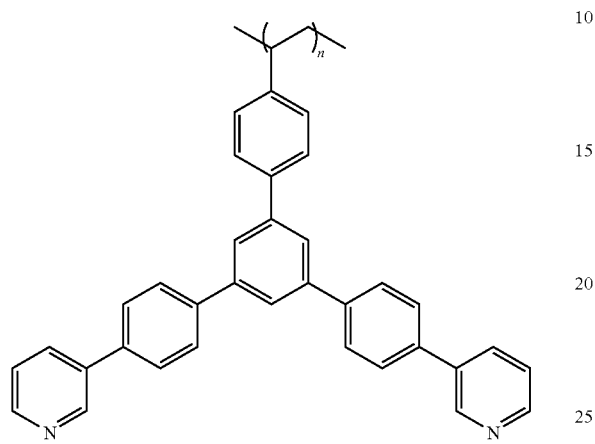
Poly(p-BPPB) is prepared from monomer (p-BPPB) (130 mg) with AIBN (1.3 mg, 0.6 wt %) as initiator following the general polymerization procedure.
Example 17
Synthesis of Monomer (p-BPPBV)
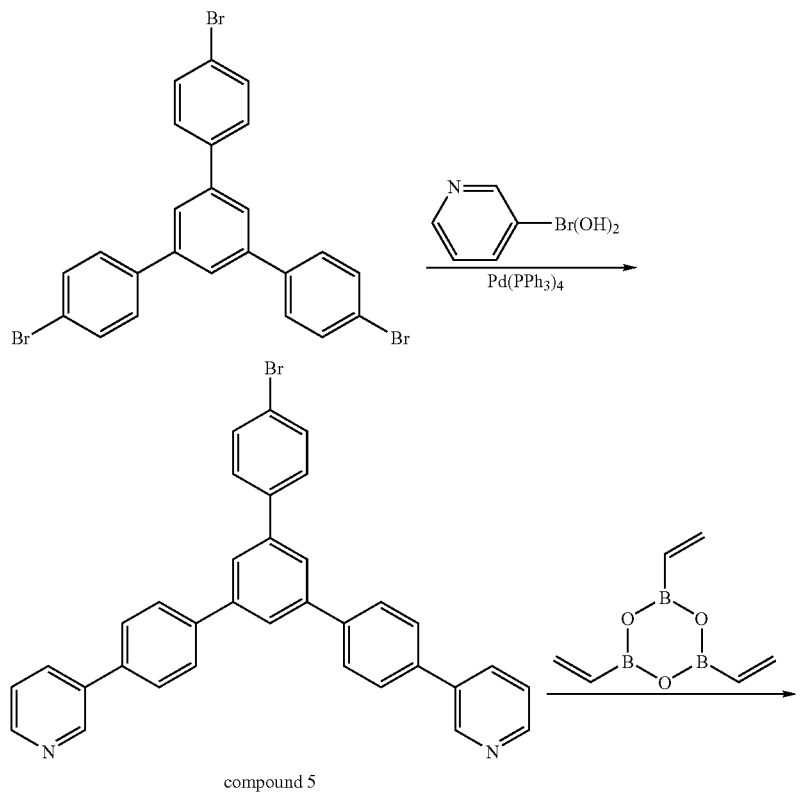

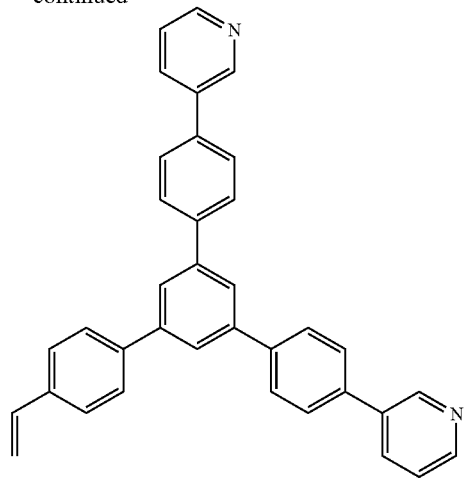

A 100 mL, two-necked, round-bottomed flask covered in tin foil and is equipped with a stirring bar, a reflux condenser fitted with a nitrogen inlet, and a stopper. The flask is charged compound 5 (1.75 g, 3.24 mmol), 1,4-dioxane (30 mL), and tetrakis (triphenylphosphine) palladium (0) (81 mg, 0.067 mmol). The apparatus is maintained under an atmosphere of nitrogen during the course of the reaction. The mixture is stirred at room temperature for 20 min then potassium carbonate (0.77 g, 5.52 mmol) dissolved in distilled water (10 mL) is added via funnel, followed by 2,4,6-trivinylcyclotriboroxane-pyridine complex (0.78 g, 3.25 mmol). The reaction mixture is stirred and heated at reflux in an oil bath for 20 h, then cooled to ambient temperature. Distilled water (30 mL) is added via a funnel, and the resulting mixture is filtered on a Büchner funnel. The filtrate is transferred to a separatory funnel and extracted with $CH_2Cl_2$ (3×30 mL). The combined organic phases are dried over $Na_2SO_4$, filtered on filter paper and concentrated to dryness by rotary evaporation (30° C., 25 mmHg). The resulting yellow solid is purified by column chromatography affording as a pale yellow solid. The solid is dissolved in a hot mixture of ethanol:dichloromethane (4:1) (50 mL) and the warm mixture is filtered through a Büchner funnel. The filtrate is collected into a flask and is allowed to cool to room temperature for 20 min. The flask is immersed for 30 min in an ice bath in order to complete precipitation. The resulting solid is collected by suction filtration on a Büchner funnel, washed with hexane (10 mL), and dried under reduced pressure (15 h at 0.1 mmHg) to provide as a white solid 1.0 g (66%). $^1$H NMR (400 MHz, $CDCl_3$) δ 8.95 (br s, 2H), 8.65 (br s, 2H), 7.98-7.43 (m, 19H), 6.84 (t, J=1.6, 1H), 5.87 (d, J=2.4, 1H), 5.35 (d, J=1.2, 1H).

Example 18

Synthesis of Compound 5

A 50 mL, round-bottomed Schlenk flask equipped with a magnetic stir bar is charged with 1,3,5-tri(4-bromobenzene) benzene (2.44 g, 4.5 mmol), 3-pyridyl boronic acid (1.83 g, 11.28 mmol) (Compound 2), 10 mL of a 2M aqueous solution of $Na_2CO_3$, and 15 mL of 1,4-dioxane. Tetrakis (triphenylphosphine) palladium (0) (0.27 g, 0.25 mmol) is added, the mixture is degassed using five vacuum/nitrogen back-fill cycles, and then is heated to 95° C. for 24 hours with vigorous stirring. The reaction mixture is allowed to cool to room temperature and diluted with $CH_2Cl_2$. The organic layer is washed with 1N HCl, $H_2O$, and brine, dried over $Na_2SO_4$, and concentrated to dryness by rotary evaporation. The resulting yellow solid is purified by column chromatography on silica gel. Eluent ethyl acetate gave compound 5 as a white solid 0.8 g (33%). $^1$H NMR (400 MHz, $CDCl_3$) δ 8.96 (br s, 2H), 8.65 (br s, 2H), 7.98-7.43 (m, 19H).

Example 19

Synthesis of Polymer of Formula XI (Poly(vinylpyridine-p-BPPB))

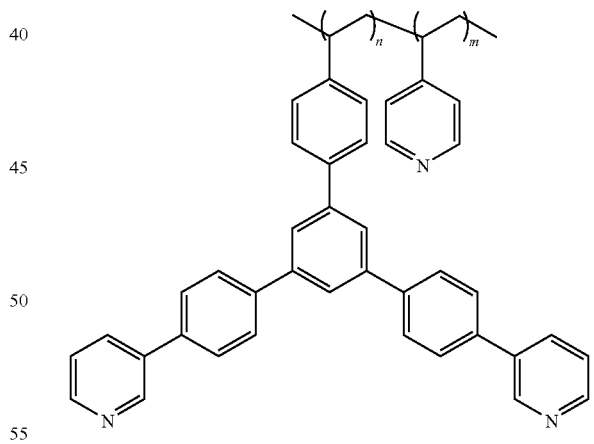

Poly(vinylpyridine-p-BPPB) is prepared from monomer (p-BPPB) (130 mg) and 4-vinyl pyridine (80 mg) in DMF (1 mL) with AIBN (2.6 mg, 1.2 wt %) as initiator following the general polymerization procedure.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A polymer comprising structural unit of formula II

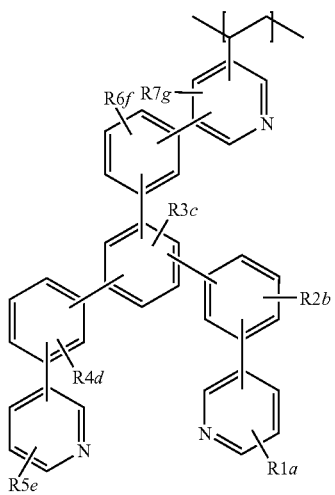

wherein

R¹, R², R³, R⁴, R⁵, R⁶ and R⁷ are independently at each occurrence a $C_1$-$C_{20}$ aliphatic radical, a $C_3$-$C_{20}$ aromatic radical, or a $C_3$-$C_{20}$ cycloaliphatic radical;

a, b, d, e and f are independently at each occurrence 0, or an integer ranging from 1 to 4; and c and g are independently at each occurrence 0, or an integer ranging from 1 to 3.

2. The polymer of claim 1, additionally comprising structural units derived from at least one monomer containing a non conductive group.

3. The polymer of claim 1, additionally comprising structural units derived from at least one monomer comprising a heteroaromatic electron transporting group.

4. The polymer of claim 3, wherein the heteroaromatic electron transporting group is selected from phenyl pyridines, triazines, and oxathiazoles.

5. The polymer of claim 1, additionally comprising structural units derived from at least one monomer comprising an aromatic or heteroaromatic hole transporting group.

6. The polymer of claim 5, wherein the aromatic or heteroaromatic hole transporting group is selected from carbazoles and triarylamines.

7. The polymer of claim 1, additionally comprising structural units derived from at least one monomer comprising at least one light emitting group.

8. The polymer of claim 7, wherein the at least one light emitting group is derived from a vinyl-functional phosphorescent dye.

9. The polymer of claim 1, comprising structural units of formula

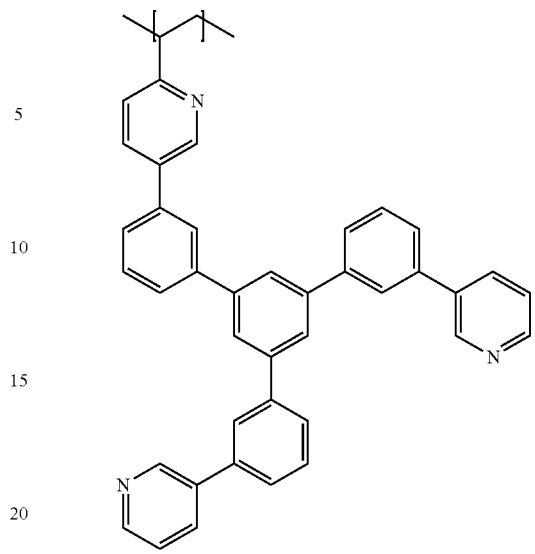

10. The polymer of claim 1, additionally comprising structural units derived from styrene.

11. The polymer of claim 1, additionally comprising structural units derived from vinyl pyridine.

12. The polymer of claim 1, comprising structural units derived from vinyl phenyl pyridine.

13. The polymer of claim 1, comprising structural units derived from vinylphenylcarbazole.

14. An optical electronic device comprising a polymer comprising structural units of formula II

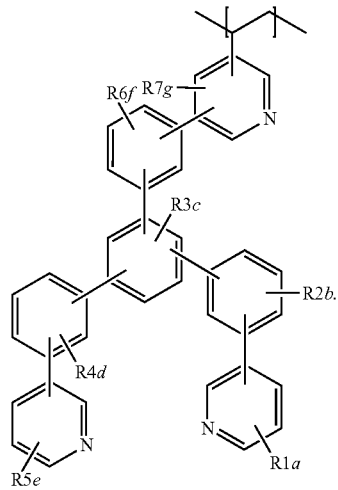

15. The optical electronic device of claim 14, wherein the optical electronic device is a single layer OLED.

16. The optical electronic device of claim 15, comprising one or more, any or a combination of blue, yellow, orange, red phosphoresce dyes.

17. The optical electronic device according to claim 14, wherein the polymer additionally comprises structural units derived from styrene.

18. The optical electronic device according to claim 14, wherein the polymer additionally comprises structural units derived from vinyl pyridine.

19. The optical electronic device according to claim 14, wherein the polymer additionally comprises structural units derived from vinyl phenyl pyridine.

20. The optical electronic device according to claim 14, wherein the polymer additionally comprises structural units derived from vinyl phenyl carbazole.

21. An optical electronic device comprising a polymer comprising structural units of formula
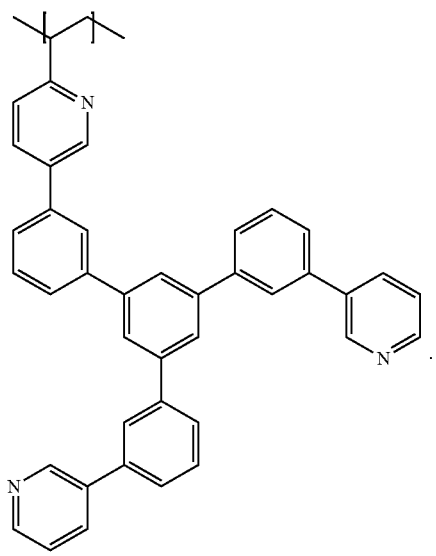
22. A compound of formula
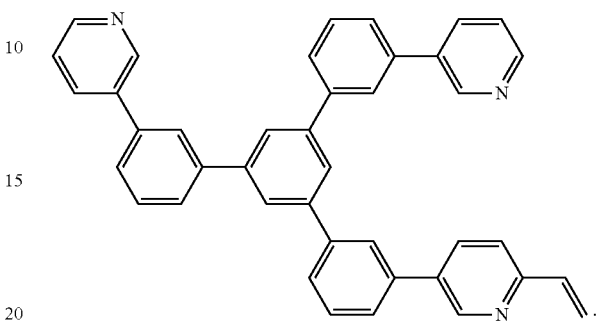
* * * * *